United States Patent
Ben-Ayun et al.

(10) Patent No.: US 7,065,335 B2
(45) Date of Patent: Jun. 20, 2006

(54) AUTOMATIC GAIN CONTROL CIRCUIT AND AN RF RECEIVER AND METHOD USING SUCH A CIRCUIT

(75) Inventors: Moshe Ben-Ayun, Shoham (IL); Mark Rozental, Gedera (IL); Roman Pasternak, Petah-Tikva (IL); Izak Avayu, Mevaseret Zion (IL)

(73) Assignee: Motorola, Inc., Schaumburg, IL (US)

( * ) Notice: Subject to any disclaimer, the term of this patent is extended or adjusted under 35 U.S.C. 154(b) by 251 days.

(21) Appl. No.: 10/490,295

(22) PCT Filed: Jun. 3, 2002

(86) PCT No.: PCT/EP02/06061

§ 371 (c)(1),
(2), (4) Date: Mar. 23, 2004

(87) PCT Pub. No.: WO03/030356

PCT Pub. Date: Apr. 10, 2003

(65) Prior Publication Data

US 2005/0003783 A1    Jan. 6, 2005

(30) Foreign Application Priority Data

Sep. 29, 2001    (GB) .............................. 0123500.1

(51) Int. Cl.
 *H04B 1/06*    (2006.01)
(52) U.S. Cl. ................. 455/240.1; 455/136; 455/232.1
(58) Field of Classification Search ................ 455/136, 455/138, 239.1, 240.1, 245.1, 232.1, 235.1, 455/249.1, 250.1, 251.1; 330/85–86, 140–141, 330/282
See application file for complete search history.

(56) References Cited

U.S. PATENT DOCUMENTS

| 5,724,652 A |   | 3/1998  | Graham et al.             |
| 5,742,899 A | * | 4/1998  | Blackburn et al. ....... 455/234.2 |
| 6,148,189 A | * | 11/2000 | Aschwanden ............ 455/234.1 |

(Continued)

FOREIGN PATENT DOCUMENTS

EP    1175005 A2 *  1/2002

(Continued)

OTHER PUBLICATIONS

Patent Abstracts of Japan vol. 1998, No. 03, Feb. 27, 1998.

*Primary Examiner*—Sonny Trinh
(74) *Attorney, Agent, or Firm*—Valerie M. Davis

(57) ABSTRACT

An automatic gain control (AGC) circuit including: a forward transmission path (214) having applied at its input an input RF signal and to provide at its output an output signal; a variable gain AGC amplifier (210) in the forward transmission path for processing the input RF signal, which amplifier has a control input 240 and is responsive to a control signal applied at its control input to vary its gain; a feedback loop (220 to 240), coupled from the output of the forward transmission path and to the control input of the AGC amplifier; an integrator (230, 232), coupled to the control input of the amplifier; a voltage source (234), coupled to the integrator and to the control input of the amplifier; and a further variable gain device (215) for varying the gain or attenuation of a signal applied to the control input of the AGC amplifier.

33 Claims, 4 Drawing Sheets

U.S. PATENT DOCUMENTS

| | | |
|---|---|---|
| 6,417,730 B1 * | 7/2002 | Segallis et al. ............. 330/129 |
| 6,437,643 B1 * | 8/2002 | Ueno et al. ................... 330/85 |
| 6,445,246 B1 * | 9/2002 | Yoshida ...................... 329/300 |
| 2002/0041206 A1 * | 4/2002 | Ueno et al. ................... 330/85 |
| 2002/0180520 A1 * | 12/2002 | Ueno et al. ................... 330/85 |
| 2004/0009758 A1 * | 1/2004 | Graham et al. .......... 455/234.1 |

FOREIGN PATENT DOCUMENTS

JP      9 289425 A      11/1997

* cited by examiner

AUTOMATIC GAIN CONTROL CIRCUIT AND AN RF RECEIVER AND METHOD USING SUCH A CIRCUIT

This application claims the benefit of prior filed co-pending international application Ser. No. PCT/EP02/06061 filed May. 3, 2002, and assigned to Motorola, Inc., which was published by the International Bureau on Apr. 10, 2003 under No. WO 03/030356 A2 and Great Britain application Ser. No. 0123500.1 filed Sep. 29, 2001.

FIELD OF THE INVENTION

The present invention relates to an automatic gain control circuit and an RF receiver and a method using such a circuit.

BACKGROUND OF THE INVENTION

A radio communication system includes, as a minimum, a transmitter and a receiver. The transmitter and the receiver (which are often each part of combined transceiver unit) are interconnected by a radio-frequency (RF) wireless channel, which provides transmission of a communication signal between them. A receiver generally includes an amplifier, which is coupled to a receiving element (an antenna). The amplifier has a gain, which can be adjusted in a predetermined range, using a control signal. Many receivers also include a device which automatically adjusts the gain of the amplifier according to the level of the received signal. The process of adjusting the gain, according to which a received signal should be amplified, is called Automatic Gain Control (AGC). AGC circuits which are required to operate rapidly when they detect a signal are known in the art as fast attack AGC circuits.

In Time Division Multiple Access (TDMA) communication systems, an RF channel is shared among users attempting to access the radio system in certain of the time-division-multiplexed time slots. This enables transmission of more than one signal at the same frequency, allowing the sequential time-sharing of each channel by two or more users. The time slots are arranged in periodically repeating frames. Each of the frames includes a certain number of time slots and each of the slots provides a signal for a specified user. Nowadays, the signal is in a digital form.

TETRA (Trans-European Trunked Radio (also known as Terrestrial Trunked Radio)) is a system specified by the European Telecommunications Standards Institute (ETSI) in which a set of standards are laid down by which digital communications especially in a TDMA form are to take place in modern communications. In particular, TETRA Direct Mode Operation (DMO) (defined in European standard ETS 300-396-2), for example, for direct communication between users operates using 1:4 TDMA format. Each frame is divided into four time slots. Each receiver operating in this system receives a signal in only one of the four time slots per frame. Such systems require either receivers that have a dynamic range large enough to account for all signal levels and/or a receivers with a very fast AGC, which can adapt very rapidly to changing levels of received signals. The received signal has a preamble length of about 0.2 ms and the AGC response should be established during this period.

In particular, where DMO communications between two transceivers or mobile stations is carried out according to TETRA standard procedures, a receiver should be able to receive a DMO signal within a sensitivity level range of from −112 dBm to −20 dBm, i.e. 92 dB of dynamic range.

In practice, signals can be in the dynamic range of from −112 dBm to 0 dBm. In addition, a DMO transmitter is permitted to have 6 dB overshoot at the beginning of the signal slot and the DMO receiver is required to be able to cope with this overshoot. This overshoot is additional to an overshoot that is usually caused by the circuit response of an AGC circuit to a step function at the beginning of a DMO signal slot. In view of these requirements an AGC circuit is required which gives improved fast attack performance compared with such circuits known in the prior art, a typical example of which is described in the following reference.

U.S. Pat. No. 5,742,899 to Blackburn et al., entitled "Fast Attack Automatic Gain Control (AGC) Loop for Narrow Band Receiver" is directed to a fast attack AGC loop having a first feedback loop with selectable response shapes and a second feedback loop with selectable response shapes. Response shape selection is based upon fast pull-down operation mode, overshoot recovery operation mode and steady state operation mode. The system described in the this reference is dedicated for operating in TDMA, and its response time is 1.5 ms for 25 kHz intermediate frequency baseband. The system has been optimized for the case when there is continuous transmission of RF power, thus allowing AGC settling to occur at the end of a time slot.

However, the prior art loop described in the said reference is not suitable for use in narrow band RF receivers or transceivers, e.g. for use in TDMA, in which the RF power is received in discontinuous bursts, such as in the TETRA Direct Mode Operation (DMO) because the response time of the loop is not sufficiently fast.

The Applicant's Copending EP Application No. 01116531.3 filed $9^{th}$ Jul. 2001 (corresponding to U.S. Ser. No. 09/614668 filed $12^{th}$ Jul. 2000) describes an AGC circuit which provides an improvement over the prior art. The purpose of the present invention is to provide a further improved AGC circuit for use in a radio communications receiver (transceiver).

SUMMARY OF THE PRESENT INVENTION

In accordance with the present invention in a first aspect, there is provided an automatic gain control (AGC) circuit comprising:

a forward transmission path having, in use, applied at its input an input RF signal and to provide at its output an output signal;

a variable gain AGC amplifier in the forward transmission path for processing the input RF signal, which amplifier has a control input and is responsive to a control signal applied at its control input to to vary its gain;

a feedback loop, coupled from the output of said forward transmission path and to said control input of said AGC amplifier, said feedback loop including a signal detector that has a predetermined non-linear gain response, depending on an input signal level, the gain being higher for greater input signal strength, an integrator, coupled to said control input of said amplifier; and, a voltage source, coupled to said integrator and to said control input of said amplifier, the circuit being characterised by the fact that it also includes a further variable gain device for varying the gain or attenuation of a signal applied as an input signal to the control input of said AGC amplifier.

The further variable gain device may comprise a further variable gain amplifier. The variable gain amplifier may be arranged to vary the gain or attenuation of a signal delivered in the feedback loop as a control input signal to the AGC amplifier. The further variable gain amplifier may for example be arranged to vary the gain of a signal applied as an input to said signal detector. The further variable gain amplifier may be included in the forward transmission path after the variable gain AGC amplifier (a forward direction being considered as the direction in which an input RF signal is passed for processing). The further variable gain device may have a control input connected to a circuit control device, e.g. a microcontroller. The circuit control device may be operable to generate control signals and apply them at the control input of the further variable gain device to adjust or change the gain of the further variable gain device.

The AGC circuit may in the normal way be operable to adjust the gain of the AGC amplifier rapidly in response to detection of an input R.F. signal applied to the AGC amplifier, such a rapid adjustment being referred to herein as an 'attack'. The period until the gain of the AGC substantially settles following initial detection of an input RF signal is referred to herein as an 'attack and settling period'.

The further variable gain device in the circuit according to the first aspect of the invention may be operable such that the signal applied as an input signal to the control input of the AGC amplifier via the feedback loop is adjusted in gain during an attack of the AGC circuit. The further variable gain device may be operable to have two or more gain levels during an attack and settling period. The gain of the further variable device may in operation be adjusted so that in a first part of the attack and settling period from a time T0 when an input RF signal is first applied to the AGC amplifier until a time T1 the gain of the further variable gain device is set at a lower level than in a second part the attack and settling period after the time T1. The further variable gain device may be operable such that during the first said part of the attack and settling period its gain is between 5 dB and 20 dB lower than in the said second part of the attack period. The time T1 may be a time of at least 50 μsec, desirably between between 100 μsec and 300 μsec, especially between 100 μsec and 200 μsec, after the time T0 and the higher gain second part of the attack period may start at the time T1. The difference in gain between the two gain levels of the variable gain device may correspond to the difference (determined by theory or experiment) between a peak overshoot level of the receiver (forward transmission path) output signal obtained using the higher gain level and a steady state level of the receiver output signal using the higher level gain. In practice the difference in gain between the two gain levels of the variable gain device may be between 5 dB and 20 dB, e.g. particularly between 9 dB and 15 dB.

In the AGC circuit according to the first aspect of the invention, the forward path may, as in the prior art, include a mixer to which an output signal from the AGC amplifier is applied. The mixer may comprise a down mixer providing as an output signal a detected signal at baseband frequency. The further variable gain device may be arranged to adjust the gain of an output signal from the mixer.

The forward transmission path may include one or more filters, e.g. low pass filters, e.g. located in the forward transmission path after a mixer. As in known circuits, an amplifier may be contained in the forward path after the or each such filter. The said further variable gain device may comprise one or more of such amplifiers. Where there is a chain of filter amplifier pairs along the forward path, the variable gain amplifier may comprise the last such amplifier in the chain, although it could alternatively be another amplifier in the chain.

The circuit according to the first aspect of the invention may include at least two feedback loops connected between the forward transmission path and the control input of the AGC amplifier, including (i) a first feedback loop connected to the forward transmission path before the low pass filter or, where there are a plurality of filters, before one of the filters, e.g. the first filter encountered by an input RF signal after processing by the AGC amplifier, e.g. between a mixer and the filter, and (ii) a second feedback loop connected to the forward transmission path after the filter or at least one of the filters, e.g. the last filter where there is a plurality of filters in the forward transmission path, each of the feedback loops incorporating a signal detector having a non-linear response gain response.

In the AGC circuit according to the first apsect of the invention an output signal provided at the output of the forward transmission path may include as phase components an in-phase (I) component and a quadrature (Q) component. The or each said signal detector of the feedback loop(s) may comprise an AGC detector, which in use receives the output signal and provides an output signal to the control input of said AGC amplifier, the output signal being related to a non-linear combination of the I and Q phase components of said output signal. The or each detetor may be a sum of squares (SOS) detector providing an output related to the sum of the squares of the level of the I and Q phase components.

In operation of the AGC circuit according to the first aspect of the invention, dependence of the gain G of the or each said signal detector on the level S of the baseband signal presented thereto may be a relationship represented by:

$$G = G_0 + kS^{1+\Delta}, \qquad \text{(Equation 1)}$$

where G is the gain of AGC loop 200, S is the signal level and $G_0$, k and $\Delta$ are predetermined parameters ($G_0$, k, $\Delta$). It is noted, that $\Delta$ can be a function of S.

A response of the or each said signal detector, to changes in the level of the signal presented thereto, may be to provide a loop of variable bandwidth, wherein the variable bandwidth is higher according to the strength of the input signal being higher.

A dependence of the variable bandwidth BW on the level S of the input baseband signal may be represented by:

$$BW = A \cdot (1+\Delta) \cdot S^{\Delta} \qquad \text{(Equation 2)}$$

where BW is a loop bandwidth, and A is a predetermined parameter.

An AGC circuit according to the first aspect of the invention which includes a first feedback loop and a second feedback loop as described earlier may be such that the signal detector of the first feedback loop has a signal strength detection threshold which is greater than that of the signal detector of the the second feedback loop.

In the AGC circuit according to the first aspect of the invention the integrator may comprise an integrating capacitor and a resistor, the integrating capacitor having an output through the resistor coupled to the control input of the AGC amplifier. The voltage source may provide to the integrator, thereby determining a level of control signal at the control input, a predetermined voltage for a predetermined preset time period beginning at a predetermined time.

The control input to the AGC amplifier may include a driver providing a substantially linear change in amplifier gain or attenuation at the AGC amplifier in response to the voltage applied thereto.

The AGC circuit according to the first apsect of the invention may include switching means allowing the AGC circuit to be switched between a first mode of operation in which the or each feedback loop is not operational and a second mode of operation in which the or each feedback loop is operational, such modes being obtained at predetermined times for predetermined time periods. The switching means may include an electrically operated switch for connecting an output terminal of the signal detector to the integrator, electrically controlled switches for connecting voltage source to the integrator and the integrator to the control input of the variable gain amplifier and a controller for providing signals to operate the switches to provide switching between the first and second modes. Switching between the modes may in operation be under the control of a circuit control device which may in practice be the same device employed to control the gain of the further variable gain device.

According to the present invention in a second aspect there is provided an RF receiver including an AGC circuit according to the first aspect. The RF receiver may be operable to receive RF signals provided in a plurality of signal time slots, each pair of adjacent signal time slots being interleaved by at least one empty time slot. The received signal may occupy one time slot of each four-slot frame of a communications operations mode, the other three slots received being empty.

In such operations, the AGC circuit may have a first operational mode in which the or each feedback loop is not operational and a second operational mode in which the or each feedback loop is operational, such modes being obtained at predetermined times for predetermined time intervals corresponding to a pattern of the signal time slots and empty time slots of the signal to be received. The first mode of operation is desirably initiated after the end of each signal time slot. The second mode of operation is desirably initiated before the start of each signal time slot.

The RF receiver according to the second aspect of the invention may be operable such that the signal to be detected is a signal received in discontinuous RF bursts, e.g. as in a direct mode operation (DMO) communications signal, usually from a transmitter operating in the same mode. The receiver and the transmitter may both be transceivers operating according to a TDMA communication procedure, e.g. for use in mobile communications units. The receiver and the corresponding transmitter may communicate in accordance with TETRA standard procedures.

According to the present invention in a third aspect there is provided a method of detecting an RF signal provided in a plurality of signal time slots, each pair of adjacent signal time slots being interleaved by at least one empty time slot, the method including use of a RF receiver according to the second aspect of the invention.

The present invention beneficially provides a novel AGC circuit, receiver incorporating the same and a method of operating the receiver to provide a fast attack automatic gain for narrow band systems with a response time of 0.5 ms or less, in many cases 0.2 ms or less, making the circuit, receiver and method suitable for use in detecting RF signals provided in discontinuous bursts in a TDMA system, especially when operating in DMO. In particular, the AGC circuit according to the invention beneficially allows a receiver incorporating it to deal efficiently with the above described wide variation of dynamic range and overshoot permitted in TDMA systems such as TETRA DMO as well as minimising the overshoot caused internally by its own response process.

Embodiments of the present invention will now be described by way of example with reference to the accompanying drawings, in which:

BRIEF DESCRIPTION OF THE
ACCOMPANYING DRAWINGS

DETAILED DESCRIPTION OF EMBODIMENTS
OF THE INVENTION

Figure 1:
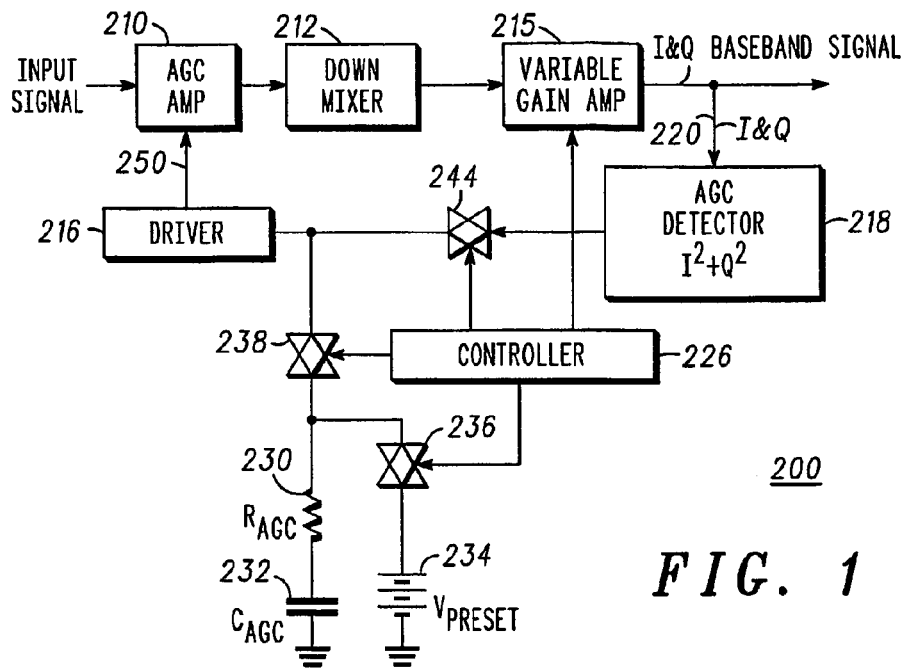
FIG. 1 is a schematic circuit diagram illustrating a fast attack automatic gain control (AGC) circuit, constructed and operational in accordance with an embodiment of the present invention.

Reference is now made to FIG. 1, which is a schematic illustration of a fast attack AGC loop, generally referenced 200, constructed and operable in accordance with an embodiment of the present invention.

AGC loop 200 includes an AGC amplifier 210 in a forward transmission path 214, a down mixer 212 and a variable gain amplifier 215 also in the forward transmission path 214, a driver 216, an AGC detector 218, a controller 226, a damping resistor $R_{AGC}$ 230, an integrating capacitor $C_{AGC}$ 232, a voltage source $V_{PRESET}$ 234 and three switches 236, 238 and 244. AGC amplifier 210 is coupled to down mixer 212 and to driver 216. The down mixer 212 is coupled to the variable gain amplifier 215. The AGC detector 218 is coupled via a connection 220 to the variable gain amplifier and at its output to switch 244. Controller 226 is coupled to switches 236, 238 and 244 and also to variable gain amplifier 215. Driver 216 is coupled to switches 238 and 244. Voltage source $V_{PRESET}$ 234 is coupled to switch 236. Damping resistor $R_{AGC}$ 230 is coupled to integrating capacitor $C_{AGC}$ 232 and to switch 238.

The input to AGC loop 200 is an input RF signal. AGC amplifier 210 receives the input R.F. signal, amplifies it and provides it to down mixer 212. The output of down mixer 212 is typically a complex baseband signal, having phase components, i.e. an in-phase (I) component and a quadrature (Q) component. The output of the down mixer is applied to the variable gain amplifier 215 the operation of which is described further below. A sample of the baseband signal provided as an output from the variable gain amplifier 215 is delivered via connection 220 to AGC detector 218. An output signal produced by AGC detector 218 is fed to integrating capacitor 232 which produces a gain control signal 240 applied to the AGC amplifier 210 via a driver 216 in order to control the gain of the AGC amplifier 210. Driver 216 produces a generally linear slope response in the AGC amplifier 210, where the slope is defined as decibels (dB) of attenuation per volt change in AGC gain control signal 240. The response could however be a non-linear one. The value of AGC gain control signal 240 depends on the operation mode of AGC loop 200. Detailed description of each of the operation modes is presented below.

A first operation mode is begun at a known point in time in the timing sequence of a received TDMA signal in an empty time slot following a signal slot and preceding another signal slot in which the signal to be detected is to be provided. In the first mode, AGC loop 200 is opened, hence the feedback loop is not operational. At this stage, switch 244 is open and switches 236 and 238 are closed. Voltage source $V_{PRESET}$ 234 charges integrating capacitor $C_{AGC}$ 232. The voltage value is determined so that the attenuation of AGC amplifier 210 will be minimal. Typically, the attenuation value is substantially zero. The time required for charging integrating capacitor $C_{AGC}$ 232 is determined by a time constant related to the product of the resistance value of damping resistor $R_{AGC}$ 230 value and the capacitance value of integrating capacitor $C_{AGC}$ 232. The first operation mode is terminated when the charging of integrating capacitor $C_{AGC}$ 232 is completed.

At the beginning of the second operation mode, controller 226 opens switch 236, thereby disconnecting voltage source $V_{PRESET}$ 234 from integrating capacitor $C_{AGC}$ 232. The remainder of the charge at integrating capacitor $C_{AGC}$ 232 defines the value of control signal 240 and hence, the gain (or attenuation) of AGC amplifier 210. Controller 226 further closes switch 244, thereby closing AGC feedback loop 200. AGC detector 218 determines the input signal level applied thereto, based on determining the vector sum of the I and Q components (obtained from the sum of squares of the I and Q components), and provides the output signal to integrating capacitor $C_{AGC}$ 232. The voltage at integrating capacitor $C_{AGC}$ 232 determines the gain of AGC amplifier 210. The beginning of the second operation mode falls in an empty time slot before the next signal slot, AGC detector 218 will therefore first detect ambient noise of the system. Upon detection of this noise, AGC detector 218 provides an output signal which is applied to adjust the gain of AGC amplifier 210, thereby increasing or decreasing (or not changing) the attenuation of the noise as described above.

The shape of the gain response of AGC detector 218 and hence, the gain of AGC loop 200 depends in a non-linear manner on the input signal level at the AGC detector 218. This gain is higher for signals that are greater than a desired signal value (AGC threshold) and low for signals that are below the threshold. An exemplary relationship for the gain variation can have the following form:

$$G=G_0+kS^{1+\Delta}, \quad \text{(Equation 1)}$$

where G is the gain of AGC loop 200, S is the signal level and $G_0$, k and $\Delta$ are predetermined parameters ($G_0$, k, $\Delta$). It is noted, that $\Delta$ can be a function of S.

The bandwidth of AGC loop 200 also depends on the signal level. Since in the type of signal to be detected, the slot, which precedes a signal slot, is generally empty, AGC loop 200 must be able to adapt itself to very fast changing signal levels. The signal rise time can be less than 0.2 ms and the range of the signal can exceed 80 dB. This requires the loop bandwidth to be maximal for high level signals, so that the AGC attack (settling) time of the loop 200 is less than 0.2 ms. The attack period of AGC loop 200 is the minimum time period which is required for the AGC loop to reach steady state operation in response to a change in input power level when a signal is first detected. Typically, the dependence of the loop bandwidth on the signal level can be proportional to the derivative of the loop gain with respect to the signal level, and is of a form:

$$BW=A \cdot k \cdot (1+\Delta) \cdot S^\Delta, \quad \text{(Equation 2)}$$

where BW is a loop bandwidth, and A is a predetermined parameter.

The attack period of AGC loop 200 depends on the value of integrating capacitor $C_{AGC}$ 232. To minimize the attack period, the value of integrating capacitor $C_{AGC}$ 232 must be as small as possible, consistent with maintaining a stable loop. A practical limit for the value of integrating capacitor $C_{AGC}$ 232 is set by the loop dynamics. If the value of integrating capacitor $C_{AGC}$ 232 is too small, then there is a significant overshoot in the loop response, which leads to signal distortions at the beginning of the signal receive slot. This problem is solved by including the connection of damping resistor $R_{AGC}$ 230 in series with integrating capacitor $C_{AGC}$ 232. This connection enables the stability of the AGC loop to be improved and enables its response time to be reduced.

Figure 2:
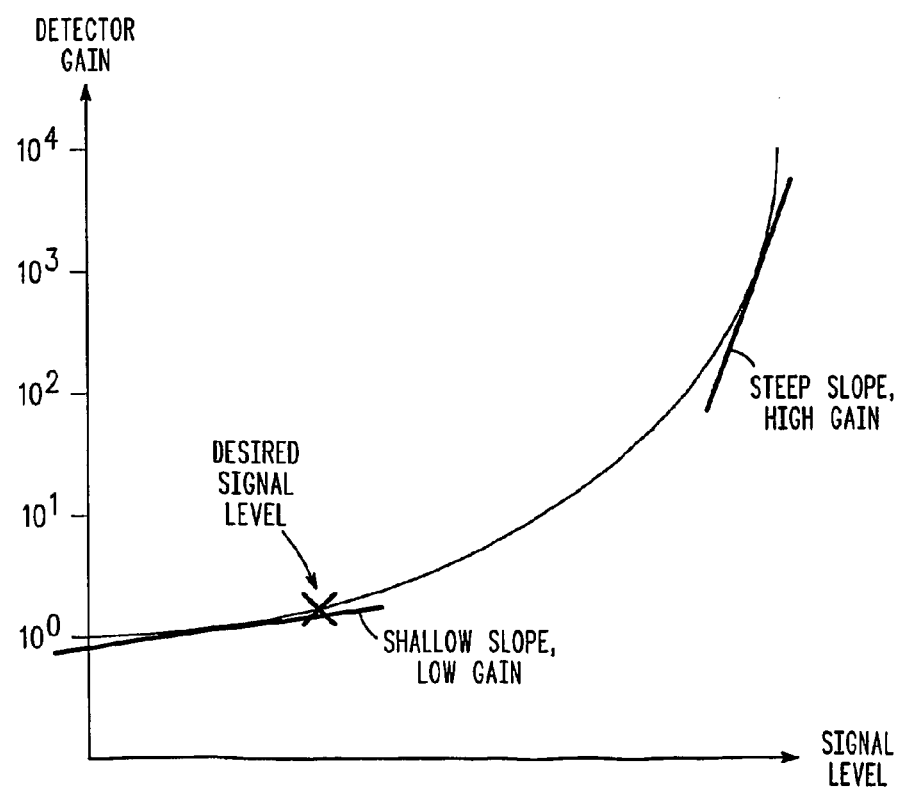
FIG. 2 is a graphical illustration of relationship between signal level and AGC detector gain in the AGC circuit of FIG. 1, constructed and operational in accordance with an embodiment of the present invention.

Reference is now made to FIG. 2, which is a graphical illustration of the dependence of the gain of AGC loop 200 on the signal level in a known manner.

Typically, the dependence of the gain of AGC loop 200 gain on the signal level is governed by Equation 1. For signal levels that are below a desired signal level (AGC threshold), the gain variations of AGC loop 200 are comparatively small. When the signal level exceeds an AGC threshold, the gain of AGC loop 200 begins to increase rapidly. The slope of the curve, which is proportional to the bandwidth of AGC loop 200, is steep for large signals above the threshold and not steep for small signals below the threshold. It means that AGC loop 200 has a fast response for signals which exceed the threshold signal level and a slow response for low-level signals.

The second operation mode continues until the end of the signal slot.

Figure 3:
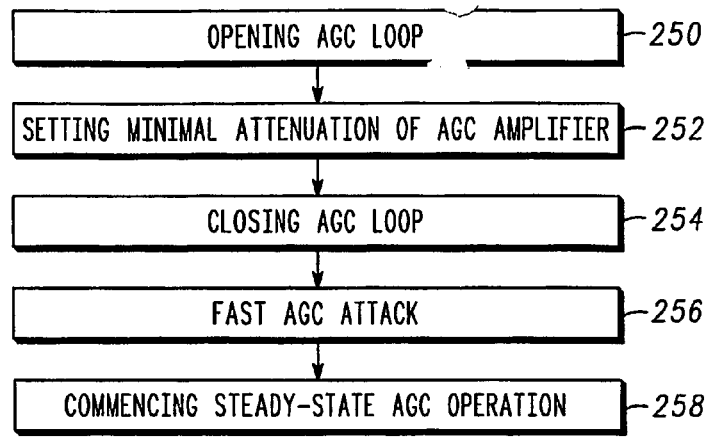
FIG. 3 is a schematic illustration of a method for operating the AGC circuit of FIG. 1.

Reference is further made to FIG. 3, which is a schematic illustration of a method for operating AGC loop 200 (FIG. 1).

In step 250, AGC loop 200 is opened. With reference to FIG. 1, controller 226 opens switch 244, thereby disconnecting AGC detector 218 from switch 238 and driver 216.

In step 252, a minimal attenuation of AGC amplifier 210 is set. With reference to FIG. 1, controller 226 closes switches 236 and 238. Voltage source $V_{PRESET}$ 234 charges integrating capacitor $C_{AGC}$ 232. The time required for charging integrating capacitor $C_{AGC}$ 232 is determined by the product of the values of the resistance value of damping resistor $R_{AGC}$ and the capacitance value of integrating capacitor $C_{AGC}$ 232. Controller 226 opens switch 236 when the charging of integrating capacitor $C_{AGC}$ 232 is completed. The voltage from charged integrating capacitor $C_{AGC}$ 232 is provided to AGC amplifier 210 via damping resistor $R_{AGC}$ 230, switch 238 and driver 216. The voltage value is determined so that the attenuation of AGC amplifier 210 will be minimal.

In step 254, AGC feedback loop is closed. With reference to FIG. 1, controller 226 closes switch 244, thereby closing the AGC feedback loop. AGC detector 218 receives a baseband signal, produces an output signal and provides it to integrating capacitor $C_{AGC}$ 232 via switches 244 and 238.

Since this operation is performed at times preceding the signal slots, AGC detector 218 will typically detect ambient noise of the system.

In step 256, a fast AGC attack takes place. With reference to FIG. 1, the circuit works with the feedback loop of AGC loop 200 closed. AGC detector 218 determines a level of the sum of squares of the I and Q components of the input signal, and provides its output signal to integrating capacitor $C_{AGC}$ 232, via switches 244, 238 and damping resistor $R_{AGC}$ 230. The voltage at integrating capacitor $C_{AGC}$ 232 determines the gain of AGC amplifier 210. At the beginning of the signal slot, AGC detector 218 will detect a fast increase of a signal level (giving the fast AGC attack). With reference to FIG. 2, both the gain and the bandwidth of AGC detector 218 are maximal for large, rapidly varying signals. Consequently, the response time of the AGC feedback loop is minimal. As the signal approaches the desired threshold, the gain of AGC detector 218 decreases. This enables the system to proceed to the steady state operation mode with a minimal overshooting. The settling procedure is helped by the use of the variable gain amplifier 215 in accordance with the invention in the manner to be described later with reference to FIGS. 5 and 6.

In step 258 shown in FIG. 3, the system proceeds to the steady state operation mode. With reference to FIG. 1, after detecting the fast AGC attack, AGC detector 218 rapidly reduces the gain of AGC loop 200. As a result, the output baseband signal level approaches the desired value. AGC detector 218 continues to monitor and adjust the signal level within a comparatively narrow value range, close to the AGC threshold. This steady state operation mode continues until the end of the signal slot.

Figure 4:
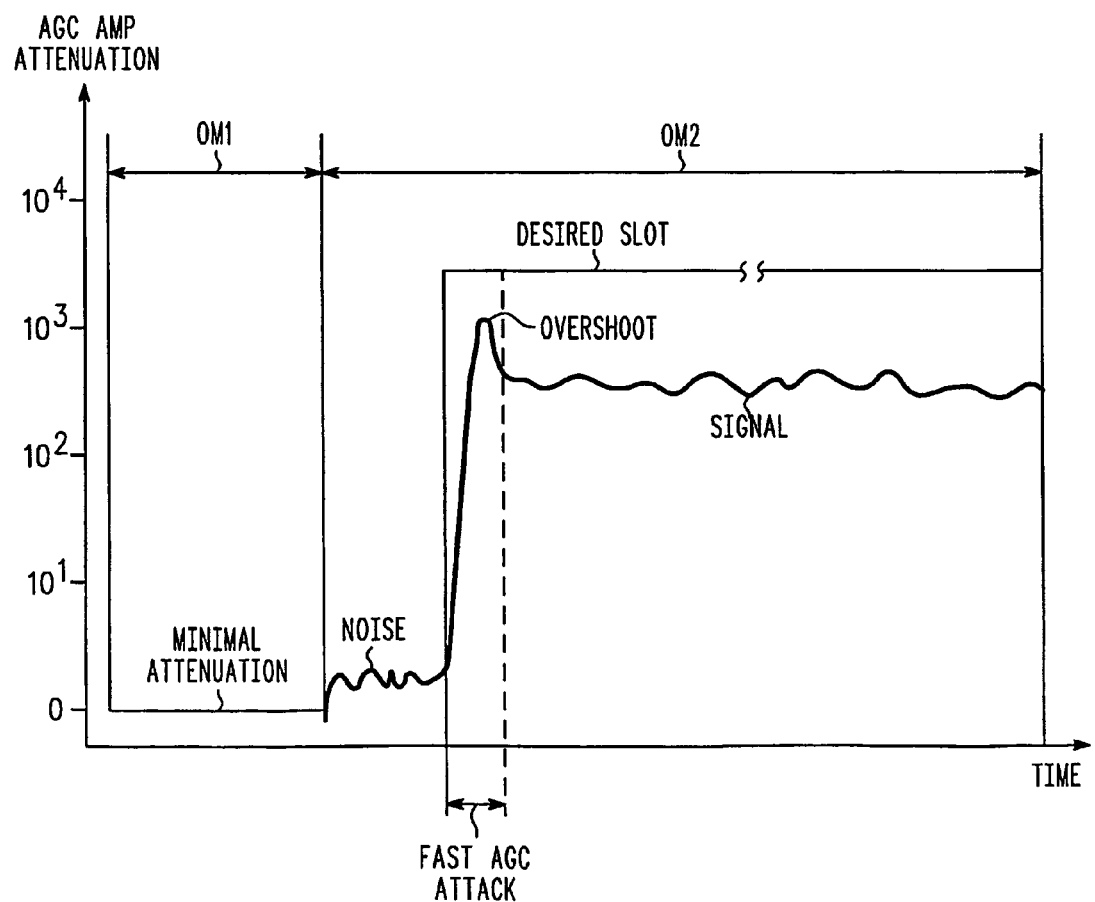
FIG. 4 is a graphical illustration of AGC amplifier gain or attenuation versus time illustrating modes of operation of the circuit of FIG. 1.

Reference is now made to FIG. 4, which is a schematic illustration of different operation modes of AGC loop 200. A first operation mode (OM1) corresponds to steps 250 and 252 of FIG. 3. At these steps, the AGC feedback loop is closed and the attenuation of AGC amplifier 210 is set to a minimal level. A second operation mode (OM2) corresponds to steps 254, 256 and 258 of FIG. 3. In this mode, AGC detector 218 of FIG. 1 monitors the signal level and controls the loop gain accordingly. At the beginning of the signal slot there is a short period of the fast AGC attack, accompanied by an overshoot. The duration of the fast AGC attack is typically less than 0.2 ms. The circuit rapidly recovers from the overshoot and continues to operate in the steady state mode until the end of the signal slot.

Figure 5:
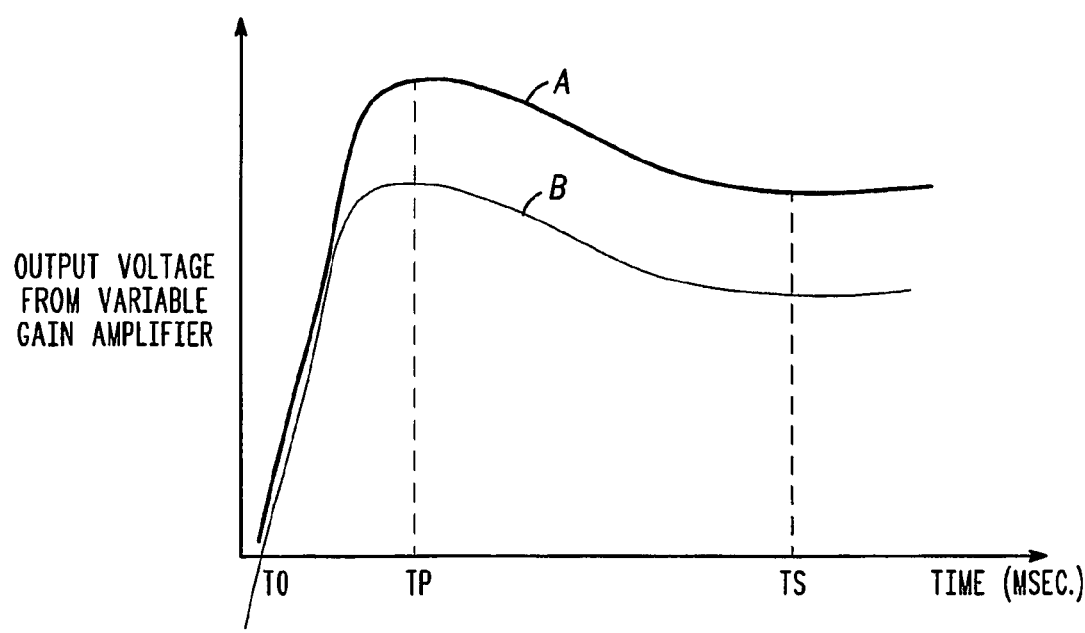
FIG. 5 is a graph of receiver output voltage (output of the variable gain amp of the circuit of FIG. 1) versus time for two different gains of the variable gain amplifier of the circuit of FIG. 1.

The role played by the variable gain amplifier 215 (FIG. 1) in the fast attack of the AGC circuit 200 will now be described. Reference is first made to FIG. 5. In FIG. 5, two curves are shown, namely a curve A corresponding to a high gain of the variable gain amplifier 215 of the circuit 200 and a curve B corresponding to a lower gain of the amplifier 215. For each of the curves A and B the voltage at the output of the variable gain amplifier 215 (signal 220 in FIG. 1) is shown as a function of time. When an AGC attack occurs at a time T0 the voltage at the receiver output (output of the variable gain amplifier 215) rises steeply until a peak is reached at a time TP after which the voltage gradually falls until it becomes settled at a time TS. For curve A the voltage reaches a significantly higher peak than that reached by curve B. The higher value of the peak of curve A contributes to an undesirably greater overshoot as described earlier. The gain of the feedback loop of the circuit 200 may be adjusted by varying the gain of the variable gain amplifier 215. Thus, the response of the feedback loop may be selected by control of the variable gain amplifier to follow either curve A or curve B. For example, when the amplifier 215 has nominal gain, the curve A may be followed and when the amplifier 215 has a reduced gain of 12 dB less than nominal the curve B may be followed.

Figure 6:
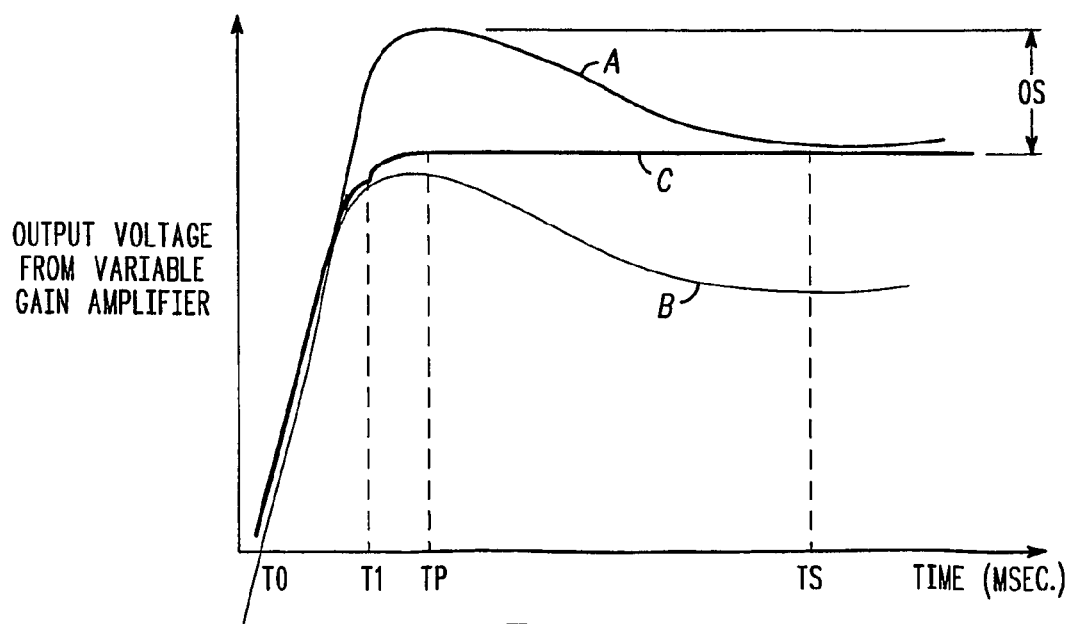
FIG. 6 is a graph as shown in FIG. 5 showing additionally a further curve for receiver output voltage obtained in practice by switching between two loop gains; and, FIG. 7 is a schematic circuit diagram illustrating a fast attack AGC circuit, constructed and operable in accordance with a further embodiment of the present invention.

Reference is now made to FIG. 6. The curves A and B shown in FIG. 5 are shown again in FIG. 6 but in this case a further curve C is shown. Curve C represents the voltage observed in practice as an output of the variable gain amplifier 215 by applying appropriate control signals thereto from the controller 226. After a fast attack begins at a time T0, the gain of the feedback loop of the circuit 200 has a reduced level by selecting a reduced gain of the amplifier 215 until a time T1. During this period the voltage comprising the receiver output signal (amplifier 215 output) or curve C follows lower curve B. At time T1 the gain of the amplifier 215 is increased. This causes the receiver output signal to rise above curve B but because some operation of the feedback loop AGC control of the AGC amplifier 210 has already occurred between T0 and T1 the rise following T1 is relatively small compared with the difference between the peaks of the two curves A and B. Thus, the curve C quickly reaches a plateau and settles to a substantially constant level at a time T2. The time T2 is much less than the time TS required for settling of curve A or curve B alone.

Thus, the gain of amplifier 215 is increased at the time T1 to cause the receiver output signal to follow curve C. The gain of amplifier 215 is changed by application of control input signals from the controller 226 (FIG. 1). The change of gain of 12 dB for the variable gain amplifier 215 was chosen because it corresponds to the change giving an overshoot of OS in the output voltage of the variable gain amplifier 215 shown in FIG. 6, namely the difference in voltage between the peak voltage and steady state voltage obtained after time TS for curve A.

Figure 7:
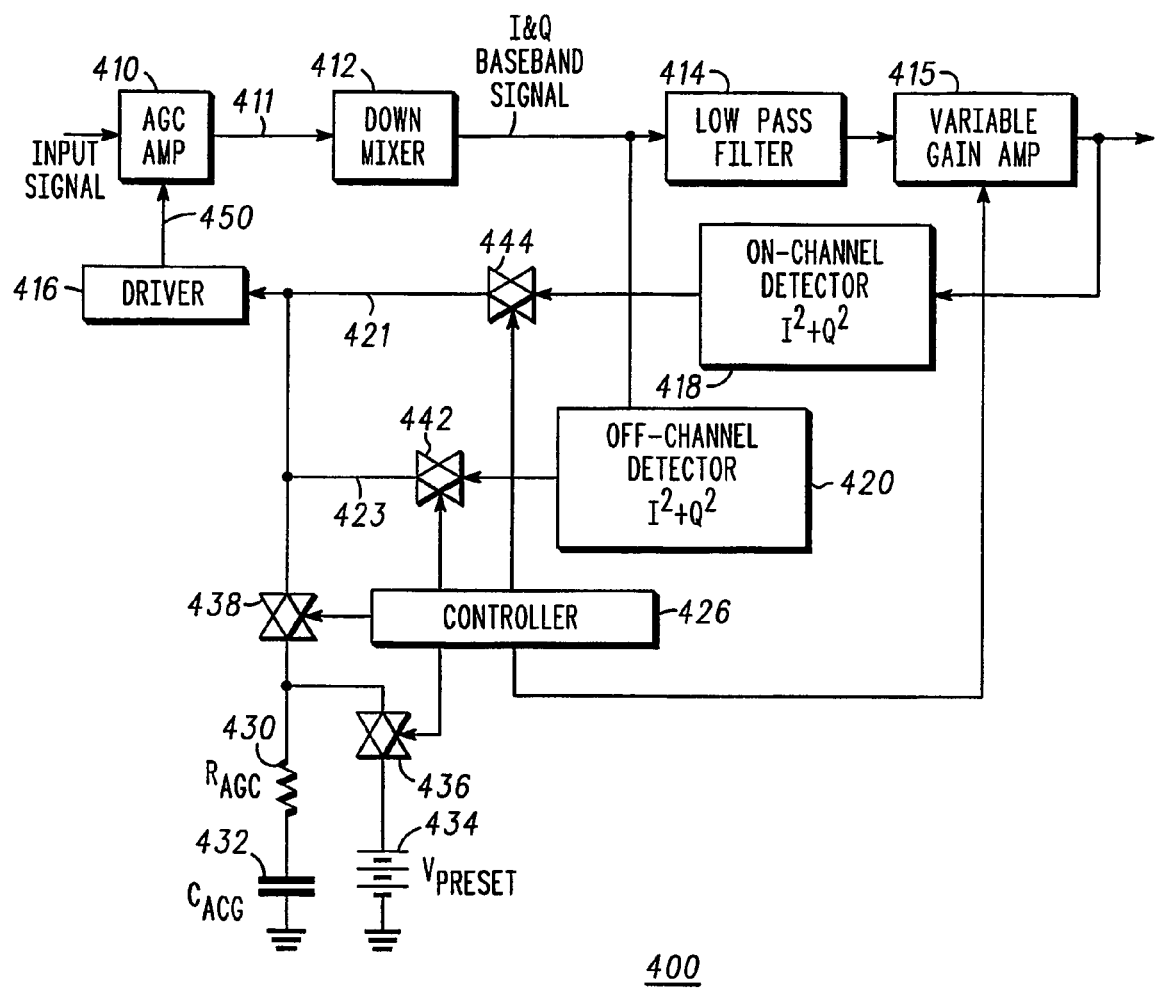

Reference is now made to FIG. 7, which is a schematic illustration of a fast attack AGC loop, generally referenced 400, constructed and operable in accordance with a further embodiment of the present invention.

An AGC loop 400 includes an AGC amplifier 410, a down mixer 412, a driver 416, a low-pass filter 414, a variable gain amplifier 415, an on-channel detector 418, an off-channel detector 420, a controller 426, a damping resistor $R_{AGC}$ 430, an integrating capacitor $C_{AGC}$ 432, a voltage source $V_{PRESET}$ 434 and four switches 436, 438, 442 and 444. AGC amplifier 410 is coupled to down mixer 412 and to driver 416. Low-pass filter 414 is coupled to down mixer 412 and to variable gain amplifier 415. Low pass filter 415 is connected to on-channel detector 418. On-channel detector 418 is coupled to switch 444. Off-channel detector 420 is coupled to down mixer 412 and to switch 442. Controller 426 is coupled to switches 436, 438, 442 and 444. Driver 416 is coupled to switches 438, 442 and 444. Voltage source $V_{PRESET}$ 434 is coupled to switch 436. Damping resistor $R_{AGC}$ 430 is coupled to integrating capacitor $C_{AGC}$ 432 and to switch 438.

AGC loop 400 includes a forward transmission path 411 and two feedback loops 421 and 423, coupled across the forward path 411. The forward transmission path 411 includes AGC amplifier 410, down mixer 412, low-pass filter 414 and variable gain amplifier 415. The input for AGC loop 400 is an RF input signal applied along the forward transmission path 411 at amplifier 410, and the output of the AGC loop 400 is a baseband signal having I and Q components delivered from the forward transmission path 411 at amplifier 415. The feedback loop 423 includes off-channel detector 420, which is coupled between the down mixer 412 output and low-pass filter 414 input. Off-channel detector 420 detects signals which are filtered out by the low pass filter 414 as well as those which are passed by the filter 414. Off-channel detector 420 controls the amplitude of adjacent channel (undesired) signals in the forward path. The feedback loop 421 includes on-channel detector 418, which is coupled to the output of low-pass filter 414. On-channel detector 418 controls the amplitude of on-channel (desired) signals in the forward path 411. Off-channel detector 420 and on-channel detector 418 provide their respective output signals to integrating capacitor $C_{AGC}$ 432. Driver 416 controls the gain of AGC amplifier 410 by providing a control signal 450. An exemplary dependence of the attenuation of AGC amplifier 410 on the voltage on integrating capacitor $C_{AGC}$ 432, can be a linear dependence of the decibels of attenuation on voltage. It is noted that there can be other types of dependencies of the attenuation of AGC amplifier 410 on the voltage on integrating capacitor $C_{AGC}$ 432. The value of control signal 450 depends on the operation mode of AGC loop 400. Detailed description of each of the operation modes is presented below.

At the beginning of the first operation mode, which corresponds to time instances preceding the signal slot, AGC loop 400 is open. Consequently, the feedback loops are not operating. Controller 426 opens switches 442 and 444 and closes switches 436 and 438. Voltage source $V_{PRESET}$ 434 charges integrating capacitor $C_{AGC}$ 432. The voltage value is determined so that the attenuation of AGC amplifier 410 will be minimal. The time period which is required for charging integrating capacitor $C_{AGC}$ 432 is specified by a product of the resistance value of damping resistor $R_{AGC}$ 430 and the capacitance value of integrating capacitor $C_{AGC}$ 432. The first operation mode is terminated when the charging of integrating capacitor $C_{AGC}$ 432 is completed.

At the beginning of the second operation mode, controller 426 opens switch 436, thereby disconnecting voltage source $V_{PRESET}$ 434 from integrating capacitor $C_{AGC}$ 432. The remainder of the charge at integrating capacitor $C_{AGC}$ 432 defines the value of control signal 450 and, hence, the gain (or attenuation) of AGC amplifier 410. Controller 426 further closes switches 444 and 442, thereby closing the AGC feedback loops. On-channel detector 418 monitors the desired baseband signal, and provides its output signal to the integrating capacitor $C_{AGC}$ 432. Off-channel detector 420 monitors undesired signal on adjacent channels. The gain of this detector is determined so that it reacts only to strong signals, which are mainly off-channel signals which are outside of the pass band of low-pass filter 414. This is because on-channel signals will already have been detected as signals above a lower threshold at the on-channel detector 418. Off-channel detector 420 provides an output signal which is combined with that of the on-channel detector 418 and fed to integrating capacitor $C_{AGC}$ 432, via switches 442 and 438 and damping resistor $R_{AGC}$ 430.

Both detectors 418 and 420 determine a level of signal overshoot of the input signals applied to those detectors. The shape of the response curve of detectors 418 and 420 depends in a non-linear manner on the signal level and can be described by Equation 1 given earlier. The graphical illustration of this dependence is as presented in FIG. 2. The bandwidth of AGC loop 400 also depends on the signal level. Since in the type of signal to be detected the slot, which precedes a signal slot, is generally empty, AGC loop 400 must be able to adapt itself rapidly to very fast changing signal levels at the beginning of the signal slot. The signal rise time period can be less than 0.2 ms and the dynamic range of the signal can exceed 80 dB. This requires the loop bandwidth to be maximal for high level signals, so that the AGC attack (settling) period is less than 0.2 ms. Typically, the dependence of the loop bandwidth on the signal level can be proportional to the derivative of the loop gain with respect to the signal level, and is described by Equation 2. Since the beginning of the second operation mode falls in an empty time slot which precedes the signal slot, off-channel detector 420 and on-channel detector 418 will first detect an ambient noise of the system. Upon detection of this noise, both detectors provide a respective output signal to AGC amplifier 410, thereby increasing the attenuation of the signal. In the second operation mode, both detectors detect the beginning of the signal slot, which is accompanied by a sharp increase in the signal level. According to Equations 1 and 2 and FIG. 2, both the gain and the bandwidth of on-channel detector 418 and off-channel detector 420 are maximal for large, rapidly varying signals. Consequently, the response time of the AGC feedback loops is minimal. As the signal approaches the desired threshold, the gain of on-channel detector 418 decreases. This reduces overshooting of the system whilst it proceeds to steady state operation. The second operation mode is completed at the end of the signal slot. It is noted that the method illustrated in FIG. 3 can be used for operating AGC loop 400.

In order to reduce further the overshoot of the system comprising the loop 400 shown in FIG. 7, the gain of the variable gain amplifier 415 is varied by controller 426 in the same manner as amplifier 215 in FIG. 1. Thus, the gain of the combined feedback loop arrangement shown in FIG. 7 is set to give a function represented by curve C in FIG. 6 by the gain level of amplifier 415 being set to a reduced level by controller 426 during a period from T0 to T1 as illustrated in FIG. 6 and being set to a higher level, e.g. 12 dB higher, during a period from T1 to T2 and onward until the end of the input R.F. signal. The gain change at time T1 was chosen in practice to be 12 dB because the overshoot labelled OS in FIG. 6 of curve A over required curve C was found to be 12 dB.

In a further embodiment of the invention (not shown), the filter-amplifier pair which includes the further variable gain amplifier, namely the low pass filter 414 and the amplifier 415 in the circuit of FIG. 7, may be replaced by a plurality, e.g. a chain, of filter-amplifier pairs. One of the amplifiers, e.g. the last of such amplifiers in the forward transmission path, may be a variable gain amplifier operated in the same manner as the amplifier 215 of FIG. 1 and the amplifier 415 in FIG. 7.

The invention claimed is:

1. An automatic gain control (AGC) circuit comprising:
   a forward transmission path having, in use, applied at its input an input RF signal and to provide at its output an output signal;
   a variable gain AGC amplifier in the forward transmission path for processing the input RF signal, which amplifier has a control input and is responsive to a control signal applied at its control input to vary its gain;
   a feedback loop coupled from the output of said forward transmission path and to said control input of said AGC amplifier, said feedback loop including a signal detector that has a predetermined non-linear gain response, depending on an input signal level, the gain being higher for greater input signal strength;
   an integrator coupled to said control input of said amplifier;
   a voltage source coupled to said integrator and to said control input of said amplifier; and
   a further variable gain device for varying the gain or attenuation of a signal applied as an input signal to the control input of said AGC amplifier.

2. A circuit according to claim 1 wherein the further variable gain device comprises a further variable gain amplifier having a control input by which a control input signal may be applied in operation to vary the gain of the further variable gain device.

3. A circuit according to claim 1 wherein the further variable gain device is arranged to be operable to vary the gain of a signal applied as an input to said detector.

4. A circuit according to claim 1 wherein the further variable gain device is included in the forward transmission path after the variable gain AGC amplifier.

5. A circuit according to claim 1 wherein the further variable gain device has a control input connected to a circuit control device providing in operation input control signals to the further variable gain device to adjust the gain thereof.

6. A circuit according to claim 1 wherein the further variable gain device is operable such that the signal applied as an input signal to the control input of the AGC amplifier via the feedback loop is adjusted in gain during an attack and settling period of the AGC circuit.

7. A circuit according to claim 6 wherein the further variable gain device is operable to have two or more gain levels during an attack and settling period.

8. A circuit according to claim 7 wherein the gain of the further variable gain device is in operation adjusted so that in a first part of the attack and settling period from a time T0 when an input RF signal is first applied to the AGC amplifier until a time T1 the gain of the further variable gain device is set at a lower level than in a second part the attack and settling period after the time T1.

9. A circuit according to claim 8 wherein the further variable gain device is operable such that during the said first part of the attack and settling period its gain is between 5 dB and 20 dB lower than in the said second part of the attack period.

10. A circuit according to claim 8 wherein the time T1 is a time of at least 50 μsec after the time T0 and the higher gain second part of the attack period starts at the time T1.

11. A circuit according to claim 10 wherein the time T1 is a time of between 100 μsec and 300 μsec after the time T0 and the higher gain second part of the attack period starts.

12. A circuit according to claim 11 wherein the time T1 is a time of between 100 μsec and 200 μsec after the time T0 and the higher gain second part of the attack period starts.

13. A circuit according to claim 7 wherein in operation the difference in gain between the two gain levels of the variable gain device corresponds substantially to the difference obtained for the output signal of the forward transmission path between a peak overshoot level of the output signal of the forward transmission path obtained using the higher gain level and a steady state level of the signal to be reached after the attack and settling period.

14. A circuit according to claim 1 wherein the forward transmission path includes a down mixer to which an output signal from the AGC amplifier is in operation applied to provide a baseband output signal and the further variable gain device is arranged so that in operation it adjusts the gain of the baseband output signal provided as an output signal from the down mixer.

15. An AGC circuit according to claim 14 wherein the baseband output signal of the mixer includes as phase components an in-phase (I) component and a quadrature (Q) component.

16. An AGC circuit according to claim 15 wherein the signal detector comprises a sum of squares (SOS) detector providing an output related to the sum of the squares of the level of the I and Q phase components.

17. A circuit according to claim 14 wherein the circuit includes one or more filters located in the forward transmission path after the AGC amplifier and after the mixer and wherein the variable gain device is located in the forward transmission path after the or one of the filters.

18. A circuit according to claim 17 wherein the forward transmission path includes a plurality of filter-amplifier pairs and the further variable gain device comprises one of the amplifiers of the filter-amplifier pairs.

19. A circuit according to claim 18 wherein the variable gain device comprises the last amplifier in plurality of filter-amplifier pairs.

20. An AGC circuit according to claim 1 wherein the forward transmission path includes a low pass filter and the variable gain device is connected to the output of the low pass filter and the AGC circuit includes at least two feedback loops connected between the forward transmission path and the control input of the AGC amplifier, including a first feedback loop connected to the forward transmission path before the low pass filter and a second feedback loop connected to the forward transmission path after the variable gain device, each of the feedback loops incorporating a signal detector having a non-linear gain response.

21. An AGC circuit according to claim 20 wherein the signal detector of the first feedback loop has a signal strength detection threshold which is greater than the signal strength detection threshold of the detector of the the second feedback loop.

22. An AGC circuit according to claim 21 wherein a response of said signal detector to changes in the level of the signal presented thereto is to provide an output signal of variable bandwidth, wherein the variable bandwidth is higher according to the strength of the input signal being higher.

23. An AGC circuit according to claim 1 wherein said integrator comprises an integrating capacitor and a resistor, the integrating capacitor having an output through the resistor coupled to said control input of said AGC amplifier, and wherein said circuit further comprises a voltage source which provides to said integrator, thereby determining a level of said control signal, a predetermined voltage for a predetermined preset time period beginning at a predetermined time.

24. An AGC circuit according to claim 1 wherein the control input to the AGC amplifier includes a driver providing in operation a substantially linear change in gain or attenuation of the AGC amplifier in response to a change in the voltage applied thereto.

25. An AGC circuit according to claim 1 which further includes switching means operable to allow the AGC circuit to be switched between a first mode of operation in which the or each feedback loop is not operational and a second mode of operation in which the or each feedback loop is operational, such modes being obtained at predetermined times for predetermined time periods.

26. An AGC circuit according to claim 25 wherein the switching means includes an electrically operated switch for connecting an output terminal of the signal detector to the integrator, one or more electrically controlled switches for connecting a voltage source to the integrator and the integrator to the control input of the variable gain amplifier and a controller for providing signals to operate the switches to provide switching between the first and second modes.

27. An RF receiver including an automatic gain control AGC circuit comprising:

a forward transmission path having, in use, applied at its input an input RF signal and to provide at its output an output signal;

a variable gain AGC amplifier in the forward transmission path for processing the input RF signal, which amplifier has a control input and is responsive to a control signal applied at its control input to to vary its gain;

a feedback loop, coupled from the output of said forward transmission path and to said control input of said AGC amplifier, said feedback loop including a signal detector that has a predetermined non-linear gain response, depending on an input signal level, the gain being higher for treater input signal strength, an integrator, coupled to said control input of said amplifier; and, a voltage source, coupled to said integrator and to said control input of said amplifier, and a further variable gain device for varying the gain or attenuation of a signal applied as an input signal to the control input of said AGC amplifier.

28. An RF receiver according to claim 27 which is operable to receive RF signals provided in a plurality of signal time slots, each pair of adjacent signal time slots being interleaved by at least one empty time slot.

29. An RF receiver according to claim 28 wherein the AGC circuit has a first mode of operation in which the or each feedback loop is not operational and a second mode of operation in which the or each feedback loop is operational, such modes being obtained alternately at predetermined times for predetermined time intervals corresponding to a pattern of the signal time slots and empty time slots.

30. An RF receiver according to claim 29 wherein the first mode of operation is initiated after the end of each signal time slot.

31. An RF receiver according to claim 29 wherein the second mode of operation is initiated before the start of each signal time slot.

32. An RF receiver according to claim 27 wherein the receiver is operable in a direct mode of operation and the signal to be detected is a direct mode communications signal.

33. An RF receiver according to claim 27 wherein the signal to be detected is communicated in accordance with TETRA standards.

* * * * *

UNITED STATES PATENT AND TRADEMARK OFFICE
CERTIFICATE OF CORRECTION

| | | |
|---|---|---|
| PATENT NO. | : 7,065,335 B2 | Page 1 of 1 |
| APPLICATION NO. | : 10/490295 | |
| DATED | : June 20, 2006 | |
| INVENTOR(S) | : Ben-Ayun et al. | |

It is certified that error appears in the above-identified patent and that said Letters Patent is hereby corrected as shown below:

Column 1, line 3, change "May 3, 2002" to --June 3, 2002--

Col. 15, claim 27, line 13, change "treater' to --greater--

Signed and Sealed this

Twenty-third Day of January, 2007

JON W. DUDAS
*Director of the United States Patent and Trademark Office*